United States Patent
Becer et al.

(10) Patent No.: US 7,093,223 B2
(45) Date of Patent: Aug. 15, 2006

(54) NOISE ANALYSIS FOR AN INTEGRATED CIRCUIT MODEL

(75) Inventors: Murat R. Becer, Round Rock, TX (US); Ilan Algor, Ganei Tikva (IL); Rajendran V. Panda, Round Rock, TX (US); David T. Blaauw, Ann Arbor, MI (US)

(73) Assignee: Freescale Semiconductor, Inc., Austin, TX (US)

( * ) Notice: Subject to any disclaimer, the term of this patent is extended or adjusted under 35 U.S.C. 154(b) by 155 days.

(21) Appl. No.: 10/304,423

(22) Filed: Nov. 26, 2002

(65) Prior Publication Data

US 2004/0103386 A1 May 27, 2004

(51) Int. Cl.
*G06F 17/50* (2006.01)
(52) U.S. Cl. ............ 716/13; 716/10; 716/14
(58) Field of Classification Search .......... 716/9, 716/12, 13, 14, 1, 4–6, 10
See application file for complete search history.

(56) References Cited

U.S. PATENT DOCUMENTS

| 5,243,546 A | 9/1993 | Maggard |
| 5,471,397 A | 11/1995 | Hsieh |
| 5,477,460 A | 12/1995 | Vakirtzis |
| 5,481,695 A | 1/1996 | Purks |
| 5,535,133 A | 7/1996 | Petschauer |
| 5,555,506 A | 9/1996 | Petschauer |
| 5,568,395 A * | 10/1996 | Huang ..................... 716/4 |
| 5,983,006 A | 11/1999 | Carlson |
| 5,987,241 A | 11/1999 | Goldberg |
| 6,128,769 A | 10/2000 | Carlson |
| 6,253,359 B1 * | 6/2001 | Cano et al. ............... 716/6 |
| 6,353,917 B1 * | 3/2002 | Muddu et al. ............. 716/6 |
| 6,601,222 B1 * | 7/2003 | Mehrotra et al. .......... 716/5 |
| 6,622,291 B1 * | 9/2003 | Ginetti ..................... 716/9 |
| 2002/0078425 A1 * | 6/2002 | Mehrotra et al. .......... 716/6 |
| 2003/0126575 A1 * | 7/2003 | Yang ....................... 716/11 |

OTHER PUBLICATIONS

Devgan et al., "Efficient coupled noise estimation for on-chip interconnects", Nov. 9-13, 1997, Computer-Aided Design, 1997. Digest of Technical Press Papers., 1997 IEEE/ACM International Conference on , pp. 147-153.*

(Continued)

*Primary Examiner*—Jack Chiang
*Assistant Examiner*—Helen Rossoshek
(74) *Attorney, Agent, or Firm*—Susan C. Hill; Joanna G. Chiu

(57) ABSTRACT

A method for designing and routing circuitry having reduced cross talk. Early noise analysis (22) is performed after global routing (12) but before detailed routing (28) in order to repair problems (24) before detailed routing (28) is performed. In one embodiment, the early noise analysis (22) is preceded by probabilistic extraction (16). In one embodiment, probabilistic extraction (16) includes determining a probability of occurrence for each configuration in a predetermined set of configurations (54). Probabilistic capacitance extraction is then performed (56). A probabilistic distributed coupled RC network is constructed using the extracted capacitances (60). In one embodiment, probabilistic extraction (16) includes estimating aggressor strength (20) using the probabilistic distributed coupled RC network.

27 Claims, 5 Drawing Sheets

OTHER PUBLICATIONS

Sato et al., "Bidirectional closed-form transformation between on-chip coupling noise waveforms and interconnect delay-chang curves", May 2003 Computer-Aided Design of Integrated Circuits and Systems, IEEE, vol. 22, Issue: 5, pp. 560-572.*

Becer et al., "Early Probabilistic Noise Estimation for Capacitively Coupled Interconnects," Advanced Tools Group, Motorola, Inc., Austin, TX & EECs Dept. University of Michigan, Ann Arbor, & CSL, University of Illinois at Urbana-Champaign, pp. 1-16.

Becer et al., "Pre-Route Noise Estimation on Interconnects of Deep Submicron Integrated Circuits," Advanced Tools Group, Motorola, Inc., Austin, TX & EECS Dept. University of Michigan, Ann Arbor, & CSL, University of Illinois at Urbana-Champaign, 6 pages.

Shepard, "Design Methodologies for Noise in Digital Integrated Circuits," DAC 98, Jun. 15-19, 1998, San Francisco, CA, pp. 94-99.

Yim et al., "Reducing Cross-Coupling Among Interconnect Wires in Deep-Submicron Datapath Design," DAC 99, New Orleans, LA, 1999, pp. 485-490.

Alpert et al., "Buffer Insertion for Noise and Delay Optimization," DAC 98, Jun. 15-19, 1998, San Francisco, CA, pp. 362-367.

Shepard et al., "Global Harmony: Coupled Noise Analysis for Full-Chip RC Interconnect Networks," IEEE 1997, pp. 139-146.

Vittal et al., "Crosstalk Reduction for VLSI," IEEE Transactions on Computer-Aided Design of Integrated Circuits and Systems, vol. 16, No. 3, Mar. 1997, pp. 290-298.

* cited by examiner

NOISE ANALYSIS FOR AN INTEGRATED CIRCUIT MODEL

RELATED APPLICATION

This is related to U.S. Pat. No. 6,480,998 issued Nov. 12, 2002, and entitled "Iterative Noise-Sensitive Method of Routing Semiconductor Nets Using a Delay Noise Threshold" which is incorporated herein by reference and is assigned to the current assignee hereof.

FIELD OF THE INVENTION

The present invention is related in general to an integrated circuit model, and more specifically to noise analysis for an integrated circuit model.

RELATED ART

As integrated circuits operate at higher frequencies and smaller geometries, functional and delay noise become more of a problem. Coupling capacitance between neighboring nets is an important component in deep submicron designs as taller and narrower lines are being laid out closer to each other. In addition, more aggressive and less noise immune circuit structures, such as dynamic logic, are now commonly used due to performance requirements. Conventionally, capacitive coupling noise or cross talk problems in integrated circuit design processes are addressed by a cross talk analysis performed after detailed routing of the nets in the integrated circuit. Following detailed routing, however, the integrated circuit layout is much less flexible. Consequently, it becomes very difficult to correct functional and delay noise problems identified after detailed routing. In turn, this may result in a longer time-to-market for the integrated circuit product.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Figure 1:
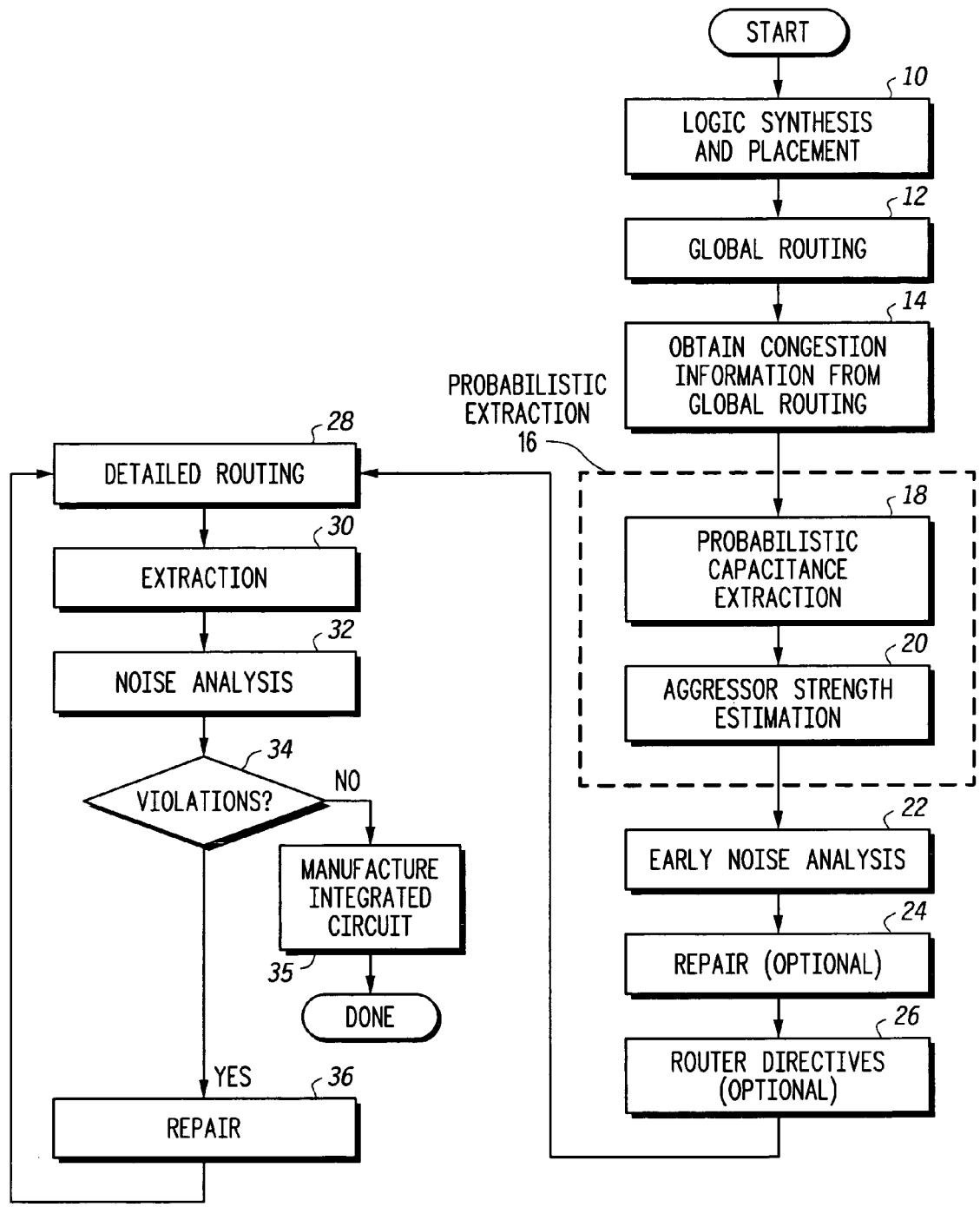
FIG. 1 illustrates a method for designing and routing circuitry having reduced cross talk in an integrated circuit in accordance with one embodiment of the present invention.

In noise analysis, a victim net is a net on which noise is injected by one or more neighboring nets through coupling capacitances. The nets that inject noise onto a victim net are considered its aggressor nets FIG. 1 illustrates a method for designing and routing circuitry having reduced cross talk in an integrated circuit in accordance with one embodiment of the present invention. The flow of FIG. 1 starts at step 10 where logic synthesis and placement are performed. The flow then continues to step 12 where global routing is performed. Global routing is one way of doing preliminary routing. Preliminary routing divides an integrated circuit design into a plurality of cells and, for each cell of the plurality of cells, determines a set of nets from the plurality of nets which traverse the cell. In one embodiment of the present invention, the global routing produces a plurality of global routing cells (i.e. g-cells). A net is at least a portion of a conductor ohmically connecting at least two different semiconductor devices in an integrated circuit.

From step 12, the flow continues to step 14 where congestion information is obtained from the global routing. In one embodiment of the present invention, congestion information includes the number of tracks available within each g-cell, the number of tracks that are being used within each g-cell, and which nets are using each g-cell. A track is an area within a g-cell in which a net may be routed. Alternate embodiments of the present invention may define congestion information in other ways. From step 14, the flow continues to step 18 where probabilistic capacitance extraction is performed. The flow then continues to step 20 where aggressor strength for each net is estimated. Steps 18 and 20 are included within probabilistic extraction step 16.

From step 20, the flow continues to step 22 where early noise analysis is performed to determine if repair 24 (optional) and the providing of router directives 26 (optional) are required to modify at least a portion of the integrated circuit model. If repair 24 and router directives 26 are not required, the flow continues to step 28. In one embodiment of the present invention, if repair 24 is required, a wide variety of techniques may be used to implement the desired repair. Router directives 26 are one possible technique that may be used to implement repair 24. Router directives 26 provide information to the detailed router used in step 28 to direct how at least a portion of the detailed routing is performed. In one embodiment of the present invention, router directives may include wide spacing, wide wiring, shielding, router constraints, etc. Alternate embodiments of the present invention may use any type of router directives. Other techniques may be used instead of or in addition to router directives 26 to implement repair 24. For example, gate sizing and buffer insertion may be used.

From step 26, the flow continues to step 28 where detailed routing is performed. The flow continues to step 30 where extraction is performed. The flow continues to step 32 where noise analysis based on the detailed routing is performed. The flow continues to decision diamond 34 where the question is asked "are there any nets violating the noise analysis thresholds?". If the answer is no, the flow continues to step 35 where the integrated circuit is manufactured. The transition from decision diamond 34 to step 35 assumes that all other design parameters have been met. If the answer to decision diamond 34 is yes, the flow continues to step 36 where repair is performed. From step 36, the flow returns to the detailed routing step 28. Note that the repair performed in step 36 may use similar techniques to the repair performed in step 24. However, note that more detailed routing information is available during repair step 36 than was available during repair step 24 due to the fact that detailed routing was performed in step 28.

Figure 2:
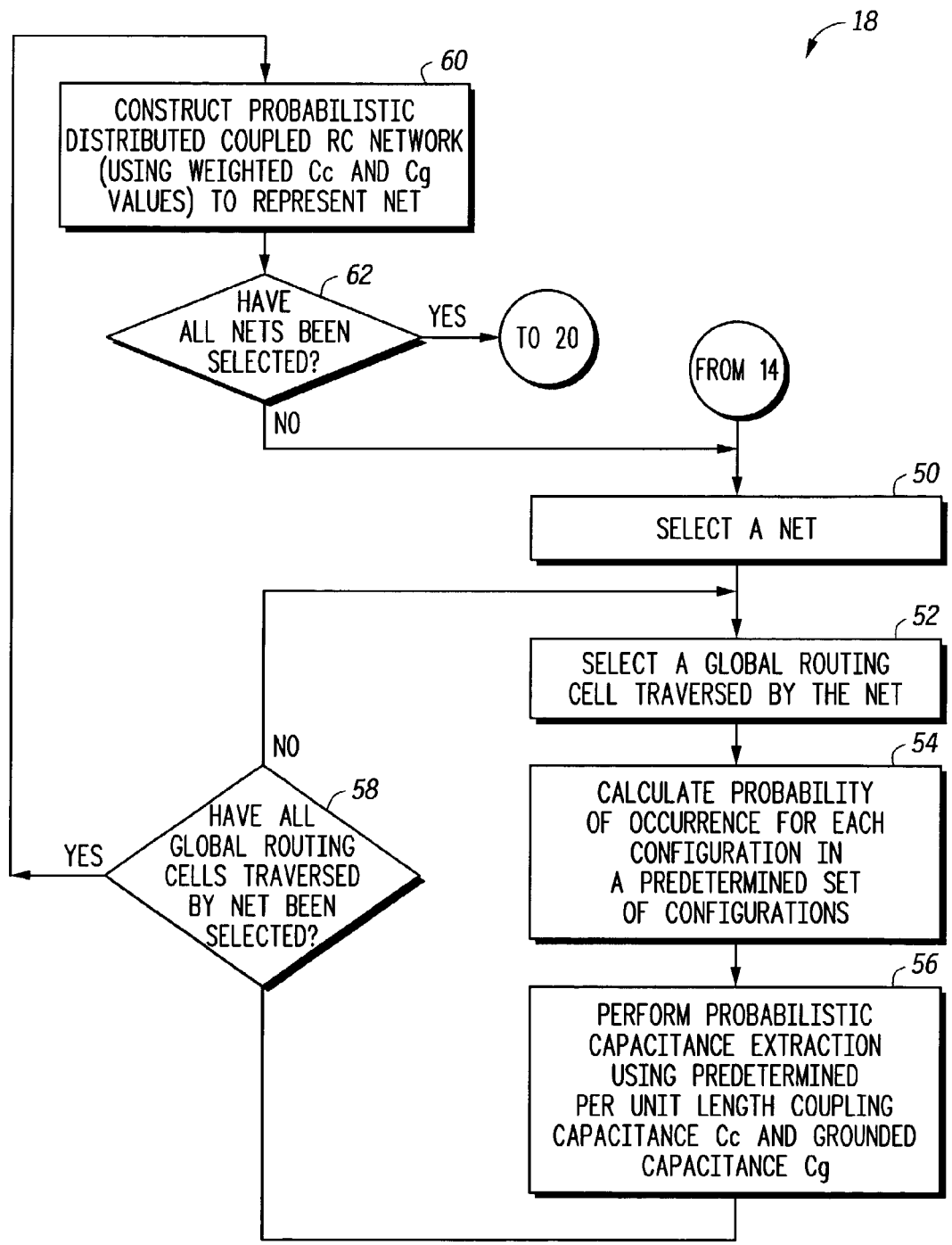
FIG. 2 illustrates a method for performing probabilistic capacitive extraction as in FIG. 1, in accordance with one embodiment of the present invention.
Figure 5:
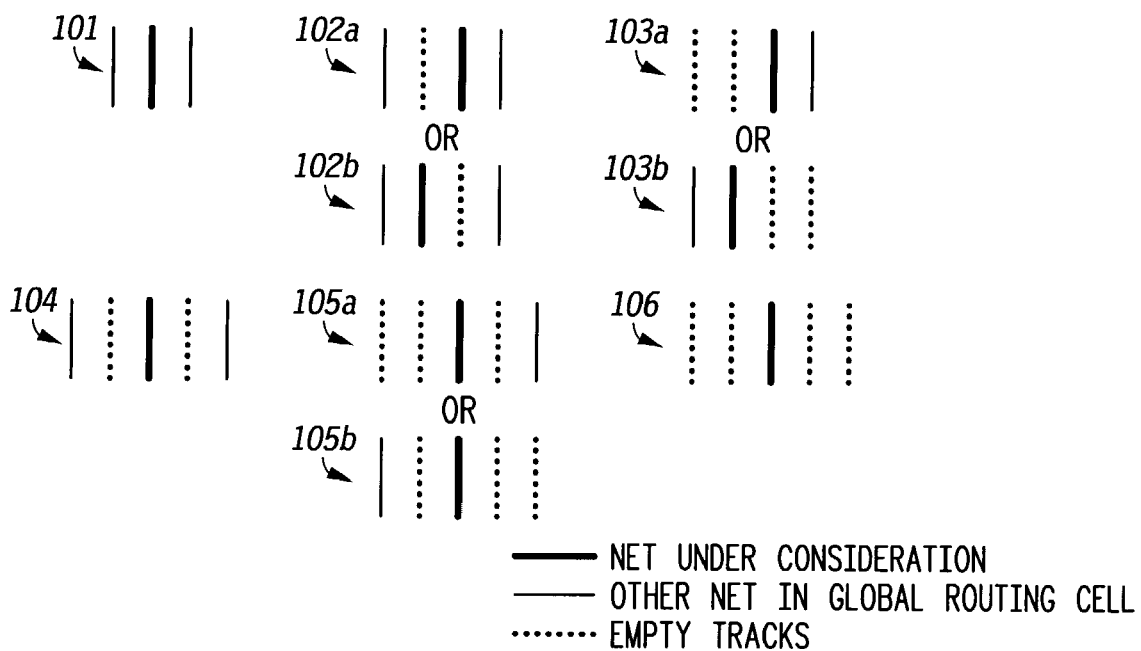
FIG. 5 illustrates a predetermined set of configurations for tracks that are not near the boundary of their global routing cell, in accordance with one embodiment of the present invention.
Figure 6:
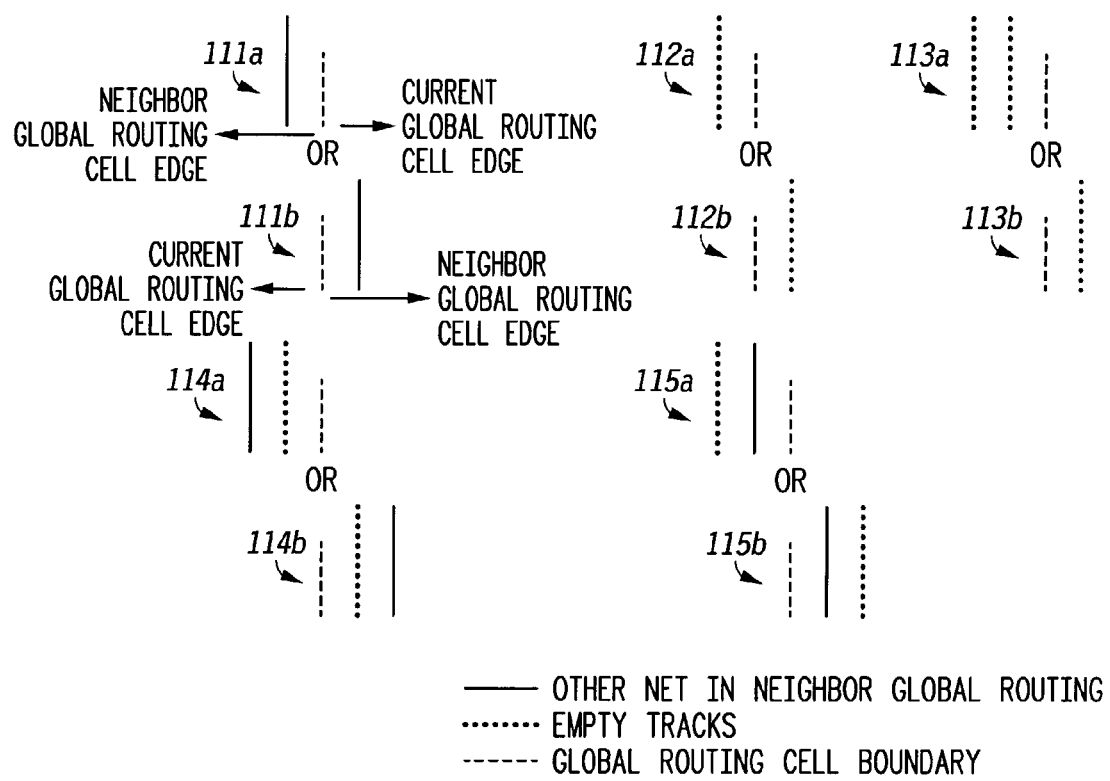
FIG. 6 illustrates a predetermined set of configurations for tracks that are near the boundary of their global routing cell, in accordance with one embodiment of the present invention.

FIG. 2 illustrates a method for performing probabilistic capacitive extraction as in FIG. 1, in accordance with one embodiment of the present invention. The flow of FIG. 2 starts at step 50 where a net is selected. The flow then continues to step 52 where a global routing cell traversed by the net is selected. The flow continues to step 54 where a probability of occurrence for each configuration in a predetermined set of configuration are determined. Note that FIG. 5 illustrates one embodiment of a set of predetermined configurations for tracks that are not near the boundary of their global routing cell. Similarly, FIG. 6 illustrates one embodiment of a set of predetermined configurations for tracks that are near the boundary of their global routing cell. Alternate embodiments of the present invention may use more, less, or different sets of predetermined configurations for various tracks.

From step 54, the flow continues to step 56 where probabilistic capacitance extraction is performed using predetermined per unit length coupling capacitance Cc and grounded capacitance Cg. In one embodiment of the present invention, the per unit length coupling capacitance Cc and ground capacitance Cg are characterized for a particular interconnect technology for the predetermined number of density configurations (e.g. six density configurations illustrated in FIG. 5) using a field simulator. Note that for one embodiment of the present invention, the value of Cc increases and the value of Cg decreases as a function of increased congestion, where congestion corresponds to the number of used tracks within a g-cell. In one embodiment of the present invention, the probabilistic capacitive extraction is performed by weighting the per unit length Cc and Cg values for each predetermined number of density configurations (e.g. six density configurations illustrated in FIG. 5). The weighting factor for each predetermined density configuration is the probability of occurrence of that particular density configuration. An example described herein below will illustrate how this weighting factor may be determined for one embodiment of the present invention. Alternate embodiments of the present invention may determine the weighting factors in other ways.

From step 56, the flow continues to decision diamond 58 where the question is asked "have all global routing cells traversed by the net been selected?". If the answer is no, the flow continues to step 52 where a different global routing cell traversed by the net is selected. If the answer is yes, the flow continues to step 60 where a probabilistic distributed coupled RC network (using the previously determined and weighted Cc and Cg values) is constructed to represent the selected net. From step 60, the flow continues to decision diamond 62 where the question is asked "have all nets been selected?". If the answer is no, the flow continues to step 50 where a different net is selected. If the answer is yes, the flow continues to step 20 in FIG. 1.

Figure 3:
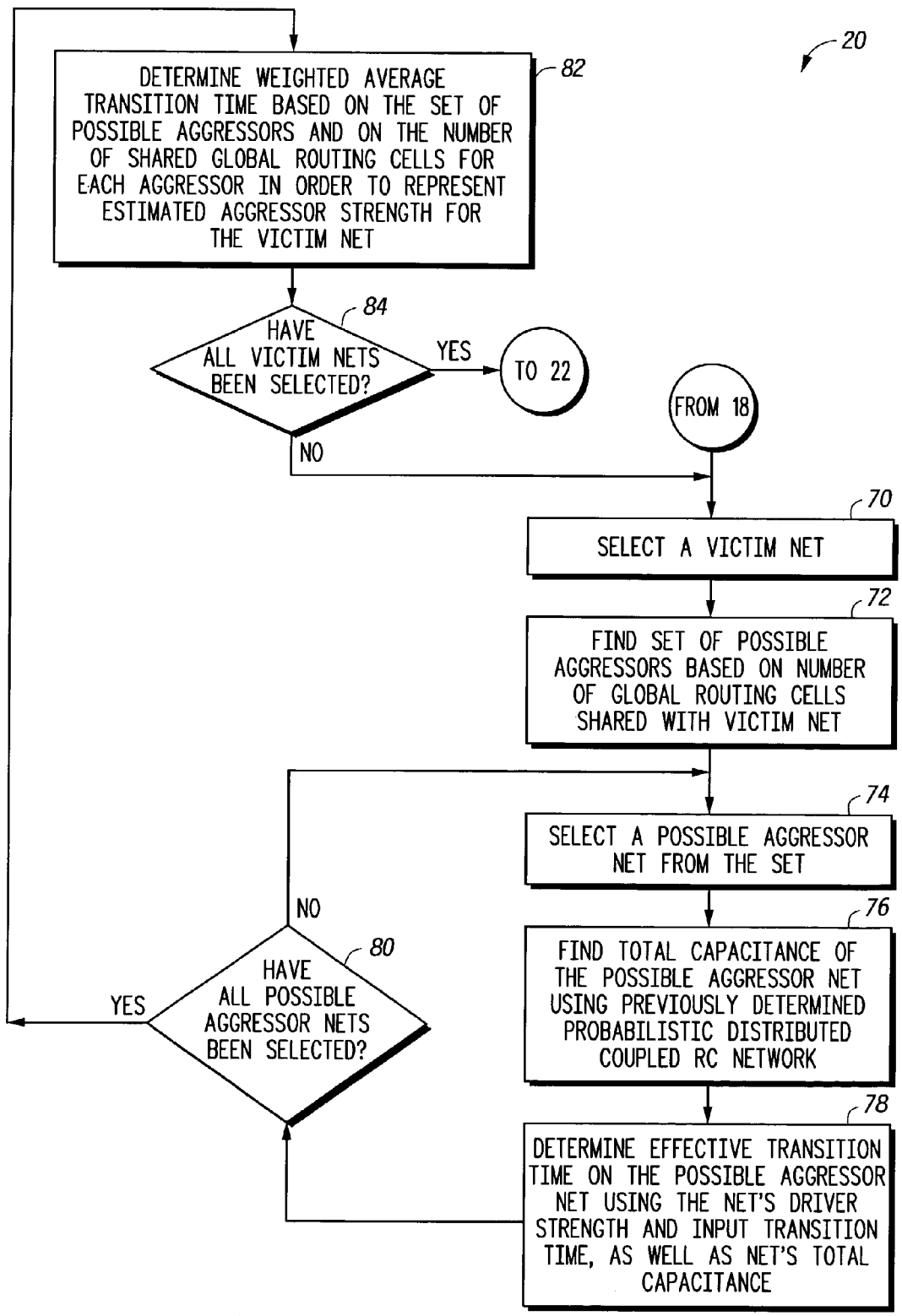
FIG. 3 illustrates a method for performing aggressor strength estimation as in FIG. 1, in accordance with one embodiment of the present invention.

FIG. 3 illustrates a method for performing aggressor strength estimation as in FIG. 1, in accordance with one embodiment of the present invention. The flow of FIG. 3 starts at step 70 where a victim net is selected. The flow then continues to step 72 where a set of possible aggressor nets is found based on the number of global routing cells shared with the victim net. In one embodiment of the present invention, a set of possible aggressors is defined to be the ten nets that share the highest number of global routing cells with the victim net. Alternate embodiments of the present invention may use any definition for the set of possible aggressor nets. Other embodiments of the present invention may not even find a set of possible aggressors, but instead may define aggressor nets in a different manner.

From step 72, the flow continues to step 74 where one possible aggressor net is selected from the set of possible aggressor nets. The flow continues to step 76 where the total capacitance of the one possible aggressor net is found using the previously determined probabilistic distributed coupled RC network of this possible aggressor net. The flow continues to step 78 where an effective transition time on the one possible aggressor net is determined using the net's driver strength and input transition time, as well as the net's total capacitance as found in step 76. In one embodiment of the present invention, the net's driver strength is a function of how quickly the net's driver can change the voltage of the net.

From step 78, the flow continues to decision diamond 80 where the question is asked "have all possible aggressor nets been selected?". If the answer is no, the flow continues to step 74 where a different possible aggressor net is selected from the set of possible aggressor nets. If the answer is yes, the flow continues to step 82 where the weighted average transition time for the victim net is determined based on the set of possible aggressors and on the number of shared global routing cells for each possible aggressor in order to represent estimated aggressor strength for the victim net. The flow then continues to decision diamond 84 where the question is asked "have all victim nets been selected?". If the answer is no, the flow continues to step 70 where a different victim net is selected. If the answer is yes, the flow continues to step 22 in FIG. 1.

Figure 4:
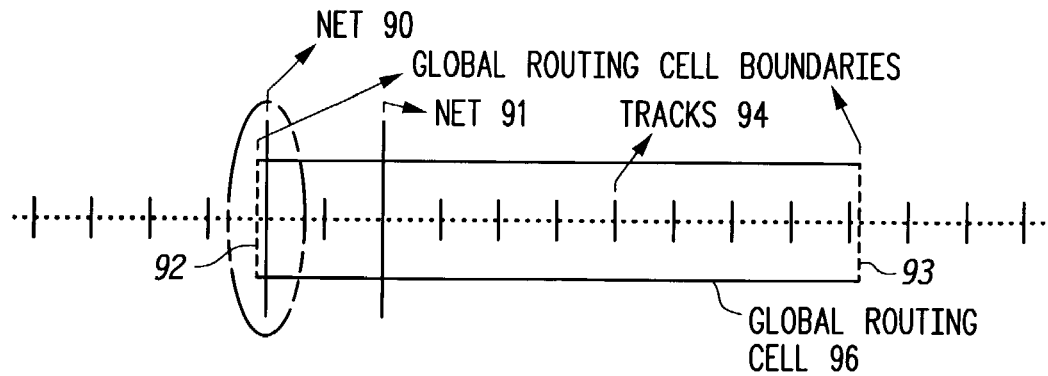
FIG. 4 illustrates a method for partitioning global routing cells into tracks, in accordance with one embodiment of the present invention.

FIG. 4 illustrates a method for partitioning global routing cells into tracks, in accordance with one embodiment of the present invention. In the illustrated embodiment, global routing cell 96 has a left global routing boundary 92 and a right global routing cell boundary 93. Global routing cell 96 includes a plurality of tracks 94, where each track is defined to be an area within the global routing cell (g-cell) 96 in which a net may be routed. In the illustrated example, two tracks within global routing cell 96 have nets routed along them, namely net 90 and net 91. Note that after global routing is performed (see step 12 in FIG. 1), it is known that nets 90 and 91 are routed within global routing cell 96; however, the location of nets 90 and 91 within g-cell 96 is not known. FIG. 4 merely illustrates one of the possible locations for nets 90 and 91. In some embodiments of the present invention, only nets that are one or two tracks away from the victim net are even considered as possibly relevant in the noise analysis. Also, in some embodiments, only the closest neighboring net on each side is considered in the noise analysis. Alternate embodiments of the present invention may consider fewer, more, or different tracks.

FIG. 5 illustrates one embodiment of a set of predetermined configurations for tracks that are not near the boundary of their global routing cell. FIG. 6 illustrates one embodiment of a set of predetermined configurations for tracks that are near the boundary of their global routing cell. Alternate embodiments of the present invention may use more, less, or different sets of predetermined configurations for various tracks. In some embodiments of the present invention, only nets that are one or two tracks away from the victim net are even considered in the noise analysis. Alternate embodiments of the present invention may consider fewer, more, or different tracks.

Referring to FIG. 5, configuration 101 illustrates a case where the net under consideration has a net in both adjacent tracks. Configuration 102a illustrates a case where the net under consideration has a net in the right adjacent track, has no net in the left adjacent track, and has a net in the second left adjacent track. Configuration 102b illustrates a case where the net under consideration has a net in the left adjacent track, has no net in the right adjacent track, and has a net in the second right adjacent track. Configuration 103a illustrates a case where the net under consideration has a net in the right adjacent track, has no net in the left adjacent track, and has no net in the second left adjacent track. Configuration 103b illustrates a case where the net under consideration has a net in the left adjacent track, has no net in the right adjacent track, and has no net in the second right adjacent track. Configuration 104 illustrates a case where the net under consideration has a net in both second adjacent tracks and has no net in both adjacent tracks. Configuration 105a illustrates a case where the net under consideration has no net in the right adjacent track, has a net in the second right adjacent track, has no net in the left adjacent track, and has no net in the second left adjacent track. Configuration 105b illustrates a case where the net under consideration has no net in the right adjacent track, has no net in the second right adjacent track, has no net in the left adjacent track, and has a net in the second left adjacent track. Configuration 106 illustrates a case where the net under consideration has no net in the right adjacent track, has no net in the second right adjacent track, has no net in the left adjacent track, and has no net in the second left adjacent track.

Referring to FIG. 6, the net under consideration is located in the current g-cell, and the various configurations are based on whether or not there is a net in the one or two neighbor tracks directly adjacent to the current g-cell. Note that the neighbor tracks are located in a right neighbor g-cell or a left neighbor cell. Configuration 111a illustrates a case where the left neighbor g-cell has a net in the rightmost track. Configuration 111b illustrates a case where the right neighbor g-cell has a net in the leftmost track. Configuration 112a illustrates a case where the left neighbor g-cell has no net in the rightmost track. Configuration 112b illustrates a case where the right neighbor g-cell has no net in the leftmost track. Configuration 113a illustrates a case where the left neighbor g-cell has no net in the two rightmost tracks. Configuration 113b illustrates a case where the right neighbor g-cell has no net in the two leftmost tracks. Configuration 114a illustrates a case where the left neighbor g-cell has no net in the rightmost track, and has a net in the second rightmost track. Configuration 114b illustrates a case where the right neighbor g-cell has no net in the leftmost track, and has a net in the second leftmost track. Configuration 115a illustrates a case where the left neighbor g-cell has a net in the rightmost track, and has no net in the second rightmost track. Configuration 115b illustrates a case where the right neighbor g-cell has a net in the leftmost track, and has no net in the second leftmost track.

The following example demonstrates the calculation of the probability of occurrence for the predetermined configuration 101 in FIG. 5, in a g-cell with n tracks and k nets that are traversing these n tracks. The number of possible enumerations that correspond to configuration 101 in FIG. 5 can be calculated as:

$$enum_{(101)} = (n-2) \times \binom{k-1}{2} \times 2 \times \binom{n-3}{k-3} \times (k-3)! + \quad \text{EQ. 1}$$
$$(k-1) \times \binom{n-2}{k-2} \times (k-2)! \times (pr(111a) + pr(111b))$$

EQ.1 is explained as follows. For the victim net (net under consideration) to satisfy configuration 101 within the g-cell, it can be anywhere except the boundary tracks of the g-cell under consideration. There are (n−2) such tracks, resulting in the first factor in EQ.1. There needs to be 2 nets in its adjacent tracks. These 2 nets can be chosen among the remaining (k−1) nets and can be in any order, resulting in the second and third factors in EQ.1. The rest of the nets should be placed on the remaining tracks. There are (k−3) nets and (n−3) tracks left, and the nets can be in any order, resulting in the two factors in the second line in EQ.1. The last line of EQ.1 is for the special cases where the victim net is on the boundary tracks of the g-cell and the neighboring g-cell congestion should be considered. The first 3 terms in the third line in EQ.1 give the number of enumerations for which the net under consideration is on the boundary tracks of the g-cell. There should be one net among (k−1) nets as one neighbor within the current g-cell, and the remaining (k−2) nets should be placed in the remaining (n−2) tracks. Note that the number of such enumerations for either side of the g-cell is equal. The probability that these enumerations can be added to configuration 101 in FIG. 5 is the probability that there will be a filled track on the immediate neighboring track, which is part of the neighboring g-cell. This is equivalent to the sum of the probabilities of configurations 111a and 111b in FIG. 6, thus the last two terms in EQ.1.

Once the number of enumerations that fall into configuration 101 in FIG. 5, is calculated as shown above, the probability of occurrence for this configuration is $$\frac{enum_{(101)}}{\binom{n}{k} \times k!} \quad \text{EQ. 2}$$

where the denominator of EQ.2 represents the total number of enumerations in a g-cell with n tracks and k nets traversing these n tracks.

EQ.3 demonstrates the calculation of the last two terms in EQ.1

$$pr(111a) = pr(111b) = \frac{k \times \binom{n-1}{k-1} \times (k-1)!}{\binom{n}{k} \times k!} = \frac{k}{n} \quad \text{EQ. 3}$$

The denominator of EQ.3 is the total number of enumerations in a neighbor g-cell with n tracks and k nets traversing these n tracks. The numerator of EQ.3 is the number of enumerations in the left neighbor g-cell, where the left neighbor g-cell has a net in the rightmost track (i.e. configuration 111a in FIG. 6). The numerator of EQ.3 is also the number of enumerations in the right neighbor g-cell, where the right neighbor g-cell has a net in the leftmost track (i.e. configuration 111b in FIG. 6)

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. For example, any type of computer or data processing system may be used to perform the noise analysis described herein. Instructions performing the noise analysis described herein may be stored on any type of medium that is readable by a computer. The noise analysis described herein may be performed on any appropriate model used to represent any desired type of integrated circuit. The integrated circuit itself may then be manufactured using all or selected parameters of the integrated circuit model.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A method for performing noise analysis in an integrated circuit model, the integrated circuit model having a plurality of nets, the method comprising:
    performing a preliminary routing of the plurality of nets by dividing the integrated circuit model into a plurality of cells and, for each cell of the plurality of cells, determining a set of nets from the plurality of nets which traverse the cell;
    determining aggressor strength or coupling capacitance and grounded capacitance for each of the plurality of nets based on the preliminary routing, wherein determining the coupling and grounded capacitance comprises: selecting a net from the plurality of nets; and for each cell traversed by the net, determining a probability of occurrence of a predetermined configuration of nets within the cell and using the probability to determine the coupling and grounded capacitance;
    performing, before detailed routing, noise analysis using the aggressor strength or the coupling and grounded capacitance; and
    performing detail routing of the integrated circuit model after performing noise analysis.

2. The method of claim 1, wherein determining the probability of occurrence of a predetermined configuration comprises determining the probability of occurrence of each configuration within a set of predetermined configurations.

3. The method of claim 2, wherein the set of predetermined configurations comprises at least one configuration of nets in both the cell and a neighboring cell.

4. The method of claim 1, wherein determining aggressor strength or coupling and grounded capacitance comprises determining the aggressor strength, wherein determining the aggressor strength comprises:
    selecting a victim net from the plurality of nets;
    determining a set of aggressor nets from the plurality of nets based on a number of cells each aggressor net shares with the victim net;
    determining transition time on each aggressor within the set of aggressor nets; and
    determining a weighted average transition time of the aggressor nets in the set of aggressor nets based on the number of cells each aggressor net shares with the victim net, wherein the weighted average transition time corresponds to an estimated aggressor strength for the selected victim net.

5. The method of claim 1, further comprising:
    prior to performing the detail routing, modifying at least a portion of the integrated circuit model in response to performing noise analysis.

6. The method of claim 1, further comprising:
    in response to performing noise analysis, generating router directives, wherein performing the detail routing uses the router directives.

7. The method of claim 1, further comprising:
    performing noise analysis after performing the detail routing.

8. A method for performing noise analysis in an integrated circuit model, the integrated circuit model having a plurality of nets, comprising:
    performing a preliminary routing of the plurality of nets by dividing the integrated circuit model into a plurality of cells and, for each cell of the plurality of cells, determining a set of nets from the plurality of nets which traverse the cell;
    selecting a net from the plurality of nets;
    selecting a first cell from the plurality of cells traversed by the selected net;
    determining a probability of occurrence of at least one predetermined configuration of nets within the first cell and determining a probability of occurrence of at least one predetermined configuration of nets within an adjacent cell;
    determining coupling and grounded capacitance of the selected net within the first cell based on the probability of occurrence of the at least one predetermined configuration of nets within the first cell and based on the probability of occurrence of at least one predetermined configuration of nets within the adjacent cell;
    constructing, before detailed routing and using the coupling and grounded capacitance, a probabilistic RC network; and
    performing, before detailed routing, noise analysis on the integrated circuit model using the probabilistic RC network.

9. The method of claim 8, wherein determining the probability of occurrence of at least one predetermined configuration of nets within the selected cell comprises determining the probability of occurrence of each configuration within a set of predetermined configurations.

10. The method of claim 9, wherein the set of predetermined configurations comprises at least one configuration of nets in both the selected cell and a neighboring cell.

11. The method of claim 9, wherein each configuration within the set of predetermined configurations corresponds to a predetermined coupling capacitance value and a predetermined grounded capacitance value.

12. The method of claim 11, wherein the coupling and grounded capacitance of the selected net within the first cell is based on the probabilities of occurrence of each configuration within the set of predetermined configurations and the corresponding predetermined coupling and grounded capacitance values.

13. The method of claim 8, further comprising:
prior to performing noise analysis, constructing a distributed coupled RC network using the coupling and grounded capacitance of the selected net within the first cell to represent the selected net.

14. The method of claim 8, further comprising:
selecting a second cell from the plurality of cells traversed by the selected net;
determining a second probability of occurrence of at least one predetermined configuration of nets within the second cell; and
determining coupling and grounded capacitance of the selected net within the second cell based on the second probability.

15. The method of claim 14, further comprising:
prior to performing noise analysis, constructing a distributed coupled RC network using the coupling and grounded capacitance of the selected net within the first and second cells to represent the selected net.

16. The method of claim 8, further comprising determining an aggressor strength for the selected net, and wherein performing noise analysis comprises performing noise analysis on the integrated circuit model using the aggressor strength and the coupling and grounded capacitance of the selected net.

17. The method of claim 8, further comprising performing a detail routing of the integrated circuit model after performing noise analysis.

18. A method for performing noise analysis in an integrated circuit model, the integrated circuit model having a plurality of nets, comprising:
performing a preliminary routing of the plurality of nets by dividing the integrated circuit model into a plurality of cells and, for each cell of the plurality of cells, determining a set of nets from the plurality of nets which traverse the cell;
determining, before detailed routing, an RC network having a plurality of non-zero resistance and capacitance values for each net in the plurality of nets, wherein the RC network selectively takes into account congestion in an adjacent cell of the plurality of cells;
selecting a victim net from the plurality of nets;
determining a set of aggressor nets from the plurality of nets based on a number of cells each aggressor net shares with the victim net determining a probability of occurrence of at least one predetermined configuration of nets within each cell traversed by each aggressor net;
determining transition time on each aggressor net within the set of aggressor nets;
determine a weighted average transition time of the aggressor nets in the set of aggressor nets based on the number of cells each aggressor net shares with the victim net, wherein the weighted average transition time corresponds to an estimated aggressor strength for the selected victim net; and
performing noise analysis using the estimated aggressor strength.

19. The method of claim 18, wherein determining the transition time on each aggressor net uses the capacitance of a corresponding aggressor net.

20. The method of claim 18, wherein the probability of occurrence is used to determine capacitance of each aggressor net.

21. The method of claim 18, further comprising performing a detail routing of the integrated circuit model after performing noise analysis.

22. An integrated circuit comprising a first component coupled to a second component via a net, at least a portion of the net having been routed on the integrated circuit according to the following method:
performing a preliminary routing of a plurality of nets in an integrated circuit model corresponding to the integrated circuit by dividing the integrated circuit model into a plurality of cells and, for each cell of the plurality of cells, determining a set of nets from the plurality of nets which traverse the cell;
determining, before detailed routing, an RC network having a plurality of non-zero resistance and capacitance values for each net in the plurality of nets, wherein a probability of occurrence of a predetermined configuration of nets within the cell is used to determine the coupling and grounded capacitance;
determining aggressor strength or coupling capacitance and grounded capacitance for each of the plurality of nets based on the preliminary routing;
performing, before detailed routing, noise analysis using the aggressor strength or the coupling and grounded capacitance; and
performing a detail routing for the integrated circuit after performing noise analysis.

23. An integrated circuit comprising a first component coupled to a second component via a net, at least a portion of the net having been routed on the integrated circuit according to the following method:
performing a preliminary routing of a plurality of nets in an integrated circuit model corresponding to the integrated circuit by dividing the integrated circuit model into a plurality of cells and, for each cell of the plurality of cells, determining a set of nets from the plurality of nets which traverse the cell;
selecting a net from the plurality of nets;
selecting a first cell from the plurality of cells traversed by the selected net;
determining a probability of occurrence of at least one predetermined configuration of nets within the first cell and determining a probability of occurrence of at least one predetermined configuration of nets within an adjacent cell;
determining coupling and grounded capacitance of the selected net within the first cell based on the probability of occurrence of the at least one predetermined configuration; and
performing noise analysis on the integrated circuit model using the coupling and grounded capacitance of the selected net.

24. An integrated circuit comprising a first component coupled to a second component via a net, at least a portion of the net having been routed on the integrated circuit according to the following method:
performing a preliminary routing of a plurality of nets in an integrated circuit model corresponding to the integrated circuit by dividing the integrated circuit model into a plurality of cells and, for each cell of the plurality of cells, determining a set of nets from the plurality of nets which traverse the cell;
determining, before detailed routing, an RC network having a plurality of non-zero resistance and capacitance values for each net in the plurality of nets;

selecting a victim net from the plurality of nets determining a probability of occurrence of a predetermined configuration of nets within the cell;

determining a set of aggressor nets from the plurality of nets based on a number of cells each aggressor net shares with the victim net;

determining transition time on each aggressor net within the set of aggressor nets;

determine a weighted average transition time of the aggressor nets in the set of aggressor nets based on the number of cells each aggressor net shares with the victim net, wherein the weighted average transition time corresponds to an estimated aggressor strength for the selected victim net; and performing noise analysis using the estimated aggressor strength; and performing a detail routing for the integrated circuit after performing noise analysis.

25. A computer readable medium comprising:

a first set of instructions for receiving an integrated circuit model having a plurality of nets;

a second set of instructions for performing a preliminary routing of the plurality of nets by dividing the integrated circuit model into a plurality of cells and, for each cell of the plurality of cells, determining a set of nets from the plurality of nets which traverse the cell;

a third set of instructions for determining aggressor strength or coupling capacitance and grounded capacitance for each of the plurality of nets based on the preliminary routing, wherein a probability of occurrence of a predetermined configuration of nets within the cell is used to determine the coupling and grounded capacitance;

a fourth set of instructions for performing noise analysis using the aggressor strength or the coupling and grounded capacitance;

a fifth set of instructions for performing a detail routing of the integrated circuit model after performing noise analysis; and a sixth set of instructions for modeling, before detailed routing, each net in the plurality of nets as an RC network having a plurality of non-zero resistance and capacitance values.

26. A computer readable medium comprising:

a first set of instructions for receiving an integrated circuit model having a plurality of nets;

a second set of instructions for performing a preliminary routing of the plurality of nets by dividing the integrated circuit model into a plurality of cells and, for each cell of the plurality of cells, determining a set of nets from the plurality of nets which traverse the cell;

a third set of instructions for selecting a net from the plurality of nets;

a fourth set of instructions for selecting a first cell from the plurality of cells traversed by the selected net;

a fifth set of instructions for determining a probability of occurrence of at least one predetermined configuration of nets within the first cell and for determining a probability of occurrence of at least one predetermined configuration of nets within an adjacent cell;

a sixth set of instructions for determining coupling and grounded capacitance of the selected net within the first cell based on the probability of occurrence of the at least one predetermined configuration; and a seventh set of instructions for performing noise analysis on the integrated circuit model using the coupling and grounded capacitance of the selected net.

27. A computer readable medium comprising:

a first set of instructions for receiving an integrated circuit model having a plurality of nets;

a second set of instructions for performing a preliminary routing of the plurality of nets by dividing the integrated circuit model into a plurality of cells and, for each cell of the plurality of cells, determining a set of nets from the plurality of nets which traverse the cell;

a third set of instructions for selecting a victim net from the plurality of nets;

a fourth set of instructions for determining a set of aggressor nets from the plurality of nets based on a number of cells each aggressor net shares with the victim net;

a fifth set of instructions for determining transition time on each aggressor net within the set of aggressor nets;

a sixth set of instructions for determining a weighted average transition time of the aggressor nets in the set of aggressor nets based on the number of cells each aggressor net shares with the victim net, wherein the weighted average transition time corresponds to an estimated aggressor strength for the selected victim net;

a seventh set of instructions for performing noise analysis using the estimated aggressor strength;

an eighth set of instructions for modeling, before detailed routing, each net in the plurality of nets as an RC network having a plurality of non-zero resistance and capacitance values and a ninth set of instructions for determining a probability of occurrence of at least one predetermined configuration of nets within each cell traversed by each aggressor net.

\* \* \* \* \*

UNITED STATES PATENT AND TRADEMARK OFFICE
CERTIFICATE OF CORRECTION

PATENT NO. : 7,093,223 B2
APPLICATION NO. : 10/304423
DATED : November 26, 2002
INVENTOR(S) : Murat Becer It is certified that error appears in the above-identified patent and that said Letters Patent is hereby corrected as shown below:

In Column 9, Line 48, Claim No. 18:
Change "shares with the victim net determining" to --share with the victim net; determining--

In Column 10, Line(s) 16-19, Claim No. 22:
Change "values for each net in the plurality of nets, wherein a probability of occurrence of a predetermined configuration of nets within the cell is used to determine the coupling and grounded capacitance;" to --values for each net in the plurality of nets;--

In Column 10, Line 22, Claim No. 22:
Change "nets based on the preliminary routing;" to --nets based on the preliminary routing, wherein a probability of occurrence of a predetermined configuration of nets within the cell is used to determine the coupling and grounded capacitance;--

In Column 11, Line 1, Claim No. 24:
Change "selecting a victim net from the plurality of nets" to --selecting a victim net from the plurality of nets;--

In Column 12, Line 44, Claim No. 27:
Change "capacitance values and a ninth set of instructions" to --capacitance values; and a ninth set of instructions--

Signed and Sealed this

Seventeenth Day of June, 2008

JON W. DUDAS
*Director of the United States Patent and Trademark Office*

UNITED STATES PATENT AND TRADEMARK OFFICE
CERTIFICATE OF CORRECTION

PATENT NO. : 7,093,223 B2
APPLICATION NO. : 10/304423
DATED : August 15, 2006
INVENTOR(S) : Murat Becer It is certified that error appears in the above-identified patent and that said Letters Patent is hereby corrected as shown below:

In Column 9, Line 48, Claim No. 18:
Change "shares with the victim net determining" to --share with the victim net; determining--

In Column 10, Line(s) 16-19, Claim No. 22:
Change "values for each net in the plurality of nets, wherein a probability of occurrence of a predetermined configuration of nets within the cell is used to determine the coupling and grounded capacitance;" to --values for each net in the plurality of nets;--

In Column 10, Line 22, Claim No. 22:
Change "nets based on the preliminary routing;" to --nets based on the preliminary routing, wherein a probability of occurrence of a predetermined configuration of nets within the cell is used to determine the coupling and grounded capacitance;--

In Column 11, Line 1, Claim No. 24:
Change "selecting a victim net from the plurality of nets" to --selecting a victim net from the plurality of nets;--

In Column 12, Line 44, Claim No. 27:
Change "capacitance values and a ninth set of instructions" to --capacitance values; and a ninth set of instructions--

This certificate supersedes the Certificate of Correction issued June 17, 2008.

Signed and Sealed this

Twenty-second Day of July, 2008

JON W. DUDAS
*Director of the United States Patent and Trademark Office*